United States Patent [19]
Grace

[11] Patent Number: 4,808,913
[45] Date of Patent: Feb. 28, 1989

[54] ASYMMETRICAL COUPLING CIRCUIT

[75] Inventor: Martin I. Grace, San Jose, Calif.

[73] Assignee: Wiltron Company, Morgan Hill, Calif.

[21] Appl. No.: 175,956

[22] Filed: Mar. 31, 1988

[51] Int. Cl.[4] ............................................. G01R 27/04
[52] U.S. Cl. ............................... 324/58 B; 324/58 R; 333/109
[58] Field of Search .......... 333/109; 324/58 R, 58 A, 324/58 B, 58.5 R, 58.5 A, 58.5 B

[56] References Cited
U.S. PATENT DOCUMENTS 3,711,769  1/1973  Peake .......................... 324/58 A X
3,789,301  1/1974  Malaviya .................... 324/58.5 B X Primary Examiner—Paul Gensler
Attorney, Agent, or Firm—Fliesler, Dubb, Meyer & Lovejoy

[57] ABSTRACT

An asymmetrical coupling circuit for use in a network analyzer is provided with a pair of couplers coupled to the input and output ports of a device under test (DUT) for improving the dynamic range of forward and reverse transmission measurements. The through-arms of the couplers are used to connect the input and output ports of the DUT to the reference signal source and measuring circuit to thereby eliminate the attenuation caused by feeding a signal through the coupling arm of the coupler as occurs in symmetrical coupler arrangements.

3 Claims, 1 Drawing Sheet

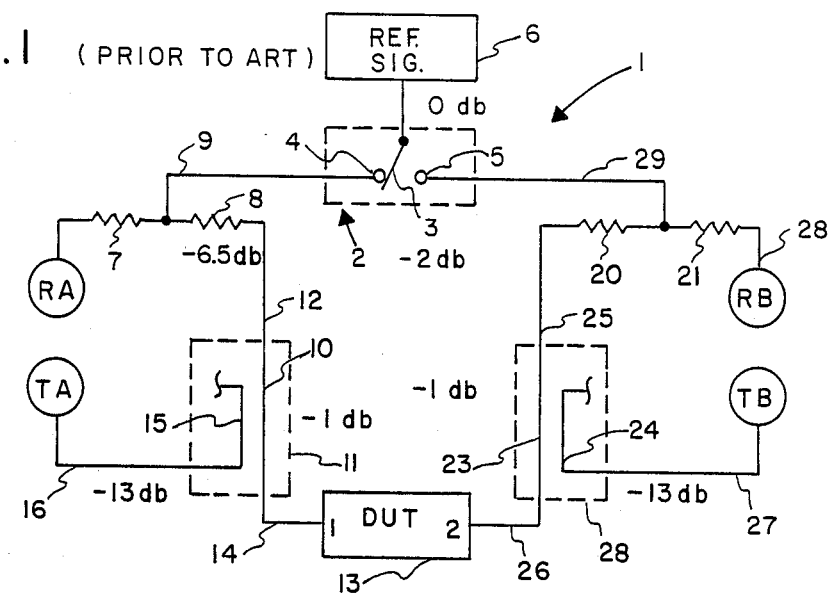
FIG. 1 (PRIOR TO ART)
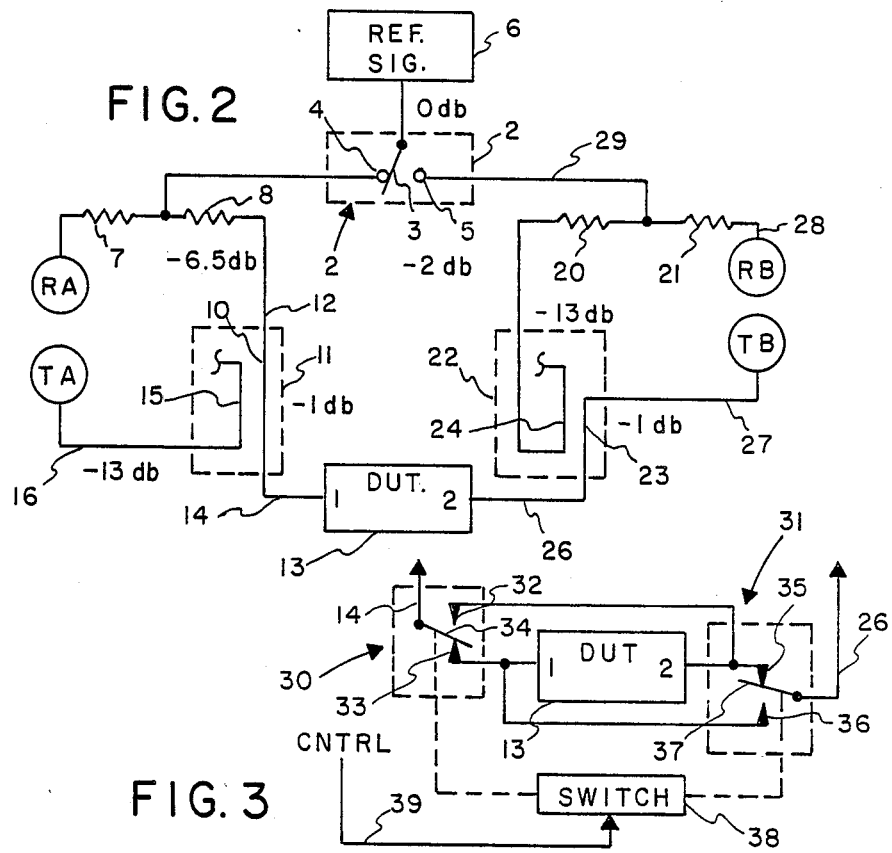
FIG. 2
FIG. 3

ASYMMETRICAL COUPLING CIRCUIT

BACKGROUND OF THE INVENTION

CROSS-REFERENCE TO RELATED APPLICATION

U.S. patent application Ser. No. 176,202 entitled "Microwave Measurement System And Associated Method", invented by Donald Bradley et al, filed on the same date as the present application, and owned currently and at the time of invention by a common assignee, is incorporated by reference.

FIELD OF THE INVENTION

The present invention relates to network analyzers in general and in particular to an asymmetrical coupling circuit for coupling a device under test into such analyzers.

DESCRIPTION OF THE PRIOR ART

A network analyzer is an apparatus for testing the performance of a device over a range of frequencies. In practice, measuring the performance of the device under test, or simply DUT, involves measuring the forward and reverse transmission characteristics and measuring the signals reflected from the input and the output ports of the DUT. For example, if RA is known as the reference signal for channel A, it is a sample of the magnitude and phase of this signal which is applied to the input of the DUT. If RB is known as the reference signal for channel B, it is a sample of the magnitude and phase of this signal which is applied to the output port of the DUT. If TA is a sample of the magnitude and phase of the signal from the input port of the DUT and if TB is a sample of the magnitude and phase of the signal from the output port of the DUT, then the performance of the DUT can be defined as follows:

Forward Measurements $$S_{21} = \frac{TB}{RA} \text{ transmitted}$$

$$S_{11} = \frac{TA}{RA} \text{ reflected}$$

Reverse Measurements $$S_{12} = \frac{TA}{RB} \text{ transmitted}$$

$$S_{22} = \frac{TB}{RB} \text{ reflected}$$

The measurements represented by the above equations are typically made using a directional coupler comprising a through-arm and having a first and a second terminal and a coupling arm having a third terminal. The coupler is designed such that a signal applied to the first terminal will pass through the coupler via the through-arm to the second terminal with little attenuation, e.g. 1 db. However, a signal applied to the second terminal will not only pass to the first terminal but will be directed via the coupling arm to the third terminal with a significant attenuation e.g. 13 db.

Heretofore, network analyzers which have used the above-described coupler for making the forward and reverse measurements represented by the above equations have used two such couplers in a symmetrical arrangement. In the symmetrical arrangement the reference signal RA is applied to the input of the DUT via the through-arm. The transmitted signal TB from the output of the DUT is measured via the coupling arm of the second coupler. The reflected signal TA from the input of the DUT is measured via the coupling arm of the first coupler. Likewise, the reference signal RB is applied to the output of the DUT via the through-arm, the transmitted signal TA from the input of the DUT is measured via the coupling arm of the first coupler and the reflected signal TB from the output of the DUT is measured via the coupling arm of the second coupler.

Current network analyzing techniques involve the use of error correction models to obtain the actual value of DUT performance from the measured values of DUT performance. For example, to obtain the actual value of the forward measurement $S_{21}$ (actual) when using a 12 term error correction model, it is necessary to measure all of the other parameters, i.e. $S_{11}$, $S_{22}$ and $S_{12}$, in addition to the parameter of interest, i.e. $S_{21}$ The values are then used in an equation having the following general format:

$$S_{21}(\text{actual}) = S_{21}(\text{measured}) +$$

$$f[S_{11}(\text{measured}), S_{22}(\text{measured}), S_{12}(\text{measured})] + (\text{error terms})$$

Because the actual value of each parameter of interest is a function of the measured value of all the other parameters when using an error correction model, it appears to have been thought necessary by prior users to use a symmetrical coupling network to obtain the measured values. However, as evident from the discussion above regarding the attenuation of signal strength when measuring a signal from the coupling arm of a coupler, the use of symmetrical couplers has resulted in a significant loss of signal, i.e. at least 12 db, when making both the forward and reverse measurements. Since the dynamic range of a circuit is the difference between the signal and the noise floor, a loss of 12 db in measured signal strength also represents a loss of 12 db in the dynamic range of the circuit.

SUMMARY OF THE INVENTION

In view of the foregoing, a principal object of the present invention is an asymmetrical coupling circuit for use in a network analyzer which provides improved performance in terms of reducing the attenuation of measured forward and reverse transmission signal strengths and increasing the dynamic range of the analyzer.

In the asymmetrical coupler circuit, a reference signal is applied to the input of a DUT via the through-arm of a first coupler and the signal reflected from the input of the DUT is measured via the coupling arm of the first coupler. A second coupler attached to the output of the DUT is coupled in such a manner that the reference signal RB is coupled to the DUT via the coupling arm of the second coupler and the measured signal TB is measured via the through-arm of the second coupler. With this arrangement, the measured transmitted signal strength $S_{21}$ and consequently the forward transmission dynamic range of the analyzer is increased by the amount of attenuation that would otherwise be present, e.g. 12 db.

While the measured reflected signal values $S_{11}$ and $S_{22}$ are the same as in the symmetrical coupler circuit, it will be noted that the reverse transmitted signal value $S_{12}$ will be attenuated by a greater amount, e.g. 12 db, than it is in the symmetrical coupler circuit. This is due to the fact that in the asymmetrical arrangement both the reference signal applied to the DUT and the measured signal from the DUT pass through the coupling arm of their respective couplers. However, it is found that the increased attenuation of $S_{12}$ has little significant effect on the actual value of the forward measurement $S_{21}$.

As discussed above, the actual measurement of a particular parameter using current error correction models is a function of the measured value of the parameter of interest and all of the other parameters. It is found, however, that the measured value of the other parameters is of second order significance in the error correction models used. Thus, the increased attenuation of the reverse transmitted signal $S_{12}$ has little effect on the accuracy of the actual forward transmitted signal value $S_{21}$.

When the actual value of the reverse transmitted signal $S_{12}$ is of interest, the decrease in signal strength of $S_{12}$ (measured) as discussed above in connection with the measurement of $S_{21}$ (actual) is easily avoided. This is done by simply reversing the connections of the DUT in the analyzer. That is, when measuring for $S_{12}$ (actual) the reference signal is applied to the output of the DUT via the through-arm of the first coupler and the signal from the input of the DUT is measured via the through-arm of the second coupler. The reversing of the DUT connections can be done manually or by means of a switching circuit.

BRIEF DESCRIPTION OF THE DRAWINGS

The above and other objects, features and advantages of the present invention will become apparent from the following detailed description of the accompanying drawing, in which:

FIG. 1 is a schematic of a prior known coupler circuit for use in network analyzers;

FIG. 2 is a schematic of an asymmetrical coupler circuit for use in a network analyzer according to the present invention; and FIG. 3 is a switching circuit for switching the ports of a device under test to the couplers in an asymmetrical coupler circuit according to the present invention.

DETAILED DESCRIPTION OF THE INVENTION

Referring to FIG. 1, there is shown a prior known symmetrical coupler circuit for use in a network analyzer designated generally as 1. In the circuit 1 there is provided a switch 2 having a wiper 3 and a first and second contact 4 and 5. The wiper 3 is coupled to a source of a reference signal 6. Contact 4 is coupled to a power splitter comprising a pair of 50 ohm resistors 7 and 8 by means of line 9. Resistor 7 is coupled to a measuring circuit RA which is provided for measuring the magnitude and phase of the reference signal from the source 6. Resistor 8 is coupled to a first terminal connected to a through-arm 10 of a first directional coupler 11 by means of a line 12. A second terminal of the through-arm 10 of the directional coupler 11 is coupled to a first port of a device under test (DUT) 13 by means of a line 14. A signal measuring circuit TA is coupled to a third terminal and coupling arm 15 of the directional coupler 11 by means of a line 16.

Contact 5 of the switch 2 is coupled to a power splitter comprising a pair of 50 ohm resistors 20 and 21 by means of a line 29. Resistor 20 is coupled to a second directional coupler 22. In coupler 22 there is provided a through-arm 23 and a coupling arm 24. The resistor 20 is coupled to a first terminal of the through-arm 23 by means of a line 25. A second terminal of the through-arm 23 is coupled to a second port of the DUT 13 by means of a line 26. A third terminal connected to the coupling arm 24 of the coupling 22 is coupled to a signal measuring circuit TB by means of a line 27. The resistor 21 is coupled to a reference signal measuring circuit RB by means of a line 28.

In operation, forward measurements $S_{21}$ and $S_{11}$ are made with the wiper 3 of the switch 2 contacting contact 4, as shown in FIG. 1. Reverse measurements $S_{12}$ and $S_{22}$ are made with the wiper 3 in a position to contact contact 5.

With the wiper 3 in position to contact contact 4, as shown in FIG. 1, a reference signal from the reference signal source 6 i split by the resistors 7 and 8. One half of the signal goes to the reference signal measuring circuit RA and the other half passes through the resistor 8 and the first coupler 11 via the through-arm 10 to the input port 1 of the DUT 13. At the input port 1 of the DUT 13, part of the reference signal is transmitted through the DUT 13 to the second coupler 22 via the line 26. In the coupler 22 the signal is coupled via the coupling arm 24 to the line 27 and thence to the measuring circuit TB. Part of the reference signal may be absorbed by the DUT 13. The remainder of the reference signal is reflected at the input port 1 of the DUT 13, back along the line 14 to the first coupler 11 and then via the coupling arm 15 and line 16 to the measuring circuit TA. The amount of reference signal transmitted through the DUT and reflected from the DUT depends upon the characteristics of the DUT.

As the reference signal is transmitted from the reference signal source 6 via the switch 2, resistor 8, through-arm 10 of the first coupler 11, the DUT 13 and the coupling arm 24 of the second coupler 22 to the measuring circuit TB and reflected from the input port 1 of the DUT 13, via the coupling arm 15 of the first coupler 11 to the measuring circuit TA, it is attenuated. For convenience, the magnitude of the attenuation is given in decibels (db). Assuming that the magnitude of the reference signal at the output of the reference signal source 6 is 0 dbm, the switch 2 produces a 2 db attenuation. As the signal passes through resistor 8 it is attenuated another 6.5 db. As the signal passes through the through-arm 10 of the coupler 11, it is attenuated 1 db. As the signal passes from the DUT 13 through the coupler 22 via the coupling arm 24 to the measuring circuit TB, it is attenuated 13 db. Neglecting the attenuation of the signal due to the DUT 13, the total attenuation of the reference signal from the reference signal source 6 to the measuring circuit TB due to the switch 2, resistor 8, coupler 11 and coupler 22 is approximately 22.5 db. If the noise floor of the signal measured at the measuring circuit TB is −110 dbm, the dynamic range of the transmission measurements in the forward direction is the difference between 110 and 22.5, or 87.5 db. Similarly, the reflected signal from the input port 1 of the DUT 13 to the measuring circuit TA via the coupling arm 15 is attenuated 13 db.

As will be shown, a 12 db reduction in the attenuation of the forward transmission signal and a corresponding increase in the dynamic range of the measuring circuit is obtained by changing the manner in which the second coupler 22 is coupled to the DUT 13.

Referring to FIG. 2, the output port 2 of the DUT 13 is coupled to the measuring circuit TB via the line 26, the through-arm 23 of the second coupler 22 and the line 27. The reference signal from the reference signal source 6 is coupled to the output port 2 of the DUT 13 via the coupling arm 24 of the coupler 22. By reversing the coupler 22 as described above, the attenuation of the signal from the DUT to the measuring circuit TB is reduced by 12 db from 13 db to 1 db, which produces a corresponding increase in the dynamic range of the circuit from 87.5 db to 99.5 db.

While reversing the coupler 22 produces an increased attenuation with respect to reverse transmission measurements by 12 db as pointed out above, the reverse transmission measurements have only a second order significance in the determination of the actual value of the forward transmission measurements. Consequently, by reversing the coupler 22 there is an improvement relative to the prior art of the dynamic range of both reciprocal and non-reciprocal devices in transmission with no significant degradation in the reflection parameters $S_{11}$ and $S_{22}$.

To obtain the same advantage for measuring the actual values of the reverse transmission parameters with the same improvement in dynamic range, the input port 1 and output port 2 of the DUT 13 are connected to the lines 26 and 14, respectively. This may be done manually or by means of a switching circuit.

Referring to FIG. 3, there is further provided in accordance with the present invention a pair of switches designated generally as 30 and 31. In the switch 30 there is provided a pair of contacts 32 and 33 and a wiper 34. In the switch 31 there is provided a pair of contacts 35 and 36 and a wiper 37. The input port 1 of the DUT 13 is coupled to the contact 33 in the switch 30 and to the contact 36 in the switch 31. The output port 2 of the DUT 13 is coupled to the contact 32 in the switch 30 and the contact 35 in the switch 31. A switch control circuit 38 which is responsive to a control signal on a line 39 controls the position of the wipers 34 and 37. The wiper 34 is connected to the through-arm 10 in the coupler 11 by means of the line 14. The wiper 37 in the switch 31 is coupled to the through-arm 23 in the coupler 22 by means of the line 26.

In operation, the switch control circuit 38 in response to a first control signal on the line 39 causes the wipers 34 and 37 to contact contacts 33 and 35, respectively, when making the forward transmission measurements.

To make the reverse transmission measurements, the switch control circuit 38 in response to a second control signal on the line 39 causes the wipers 34 and 37 to switch to contacts 32 and 36, respectively.

While embodiments of the present invention are described above, it is contemplated that various modifications may be made thereto without departing from the spirit and scope of the present invention. For example, while mechanical switches 2, 30 and 31 are described, it is understood that in a preferred embodiment, the switches would be solid state switches which are controlled by suitable logic circuits. Additionally, any device which is capable of separating incident and reflected signals may be used in place of the couplers 11 and 22. Accordingly, it is intended that the embodiments described be considered only as illustrations of the present invention and that the scope thereof should not be limited thereto but be determined by reference to the claims hereinafter provided.

What is claimed is:

1. An asymmetrical coupling circuit for use in a network analyzer comprising:
   a first and a second directional coupler, each of said couplers having a through-arm and a coupling arm;
   first means for coupling a device under test to a source of a reference signal via said through-arm of said first coupler;
   second means for coupling said device under test to a first signal measuring circuit via said coupling arm of said first coupler;
   third means for coupling said device under test to said source via said coupling arm of said second coupler; and
   fourth means for coupling said device under test to a second signal measuring circuit via said through-arm of said second coupler.

2. A circuit according to claim 1 wherein said device under test comprises a first port and a second port and means for selectively coupling each of said ports to said through-arms of said first and said second couplers such that when said first port is coupled to said first coupler said second port is coupled to said second coupler and when said first port is coupled to said second coupler said second port is coupled to said first coupler.

3. A circuit according to claim 1 wherein said coupling means comprises a switching means.

* * * * *

UNITED STATES PATENT AND TRADEMARK OFFICE
CERTIFICATE OF CORRECTION

PATENT NO. : 4,808,913

DATED : February 28, 1989

INVENTOR(S) : Martin I. Grace

It is certified that error appears in the above-identified patent and that said Letters Patent is hereby corrected as shown below:

Column 3, line 37, before "coupler" insert --symmetrical--.
Column 4, line 18, "i" should be --is--.

Signed and Sealed this

Fifteenth Day of August, 1989

Attest:

DONALD J. QUIGG

Attesting Officer

Commissioner of Patents and Trademarks